United States Patent [19]

Chloupek et al.

[11] Patent Number: 4,804,928
[45] Date of Patent: Feb. 14, 1989

[54] PHASE-FREQUENCY COMPARE CIRCUIT FOR PHASE LOCK LOOP

[75] Inventors: James E. Chloupek, Plano, Tex.; Richard E. Boucher, Santa Clara, Calif.

[73] Assignee: Texas Instruments Incorporated, Dallas, Tex.

[21] Appl. No.: 49,063

[22] Filed: May 12, 1987

[51] Int. Cl.[4] .............................................. H03L 7/00
[52] U.S. Cl. .................................. 331/1 A; 328/133; 307/528
[58] Field of Search .............. 331/1 A, 25; 328/133, 328/155; 307/510, 511, 528; 375/120

[56] References Cited

U.S. PATENT DOCUMENTS 4,593,254 6/1986 Coburn .............................. 331/1 A
4,594,563 6/1986 Williams ........................... 331/1 A Primary Examiner—Eugene R. Laroche
Assistant Examiner—Robert J. Pascal
Attorney, Agent, or Firm—Richard G. Coalter; Leo N. Heiting; Melvin Sharp

[57] ABSTRACT

A phase-locked loop circuit having a charge pump and a voltage controlled oscillator which includes a phase/frequency comparator having a single circuit for operating in phase or frequency modes and which uses the discharge signal from the oscillator flip flop to trigger resetting of the input flip flop and which uses a one-shot in the phase compare mode for high frequency operation.

14 Claims, 4 Drawing Sheets

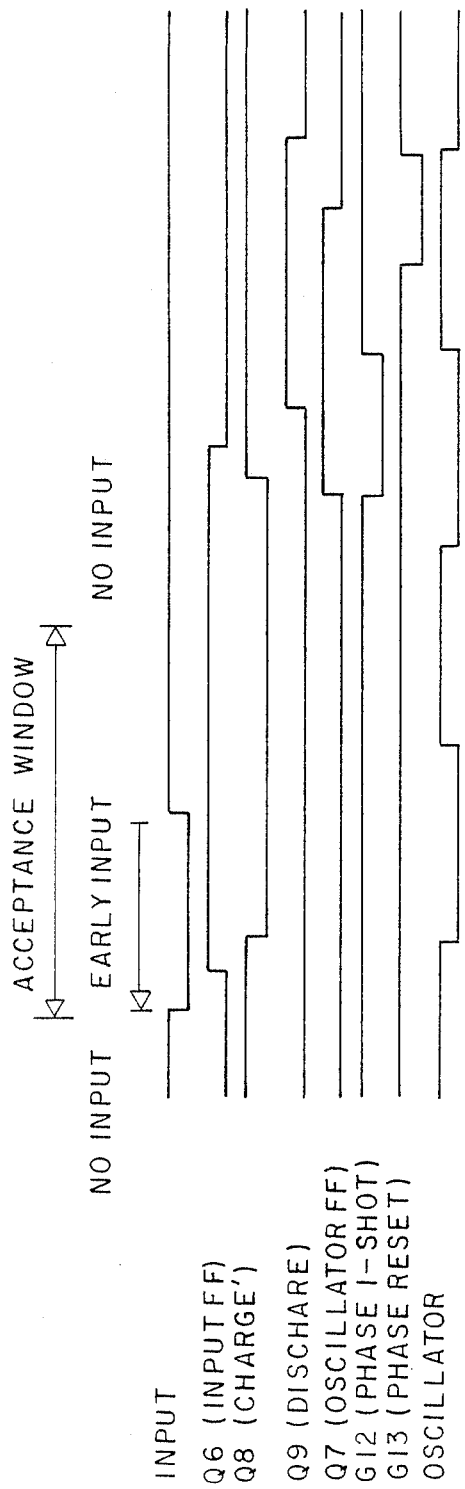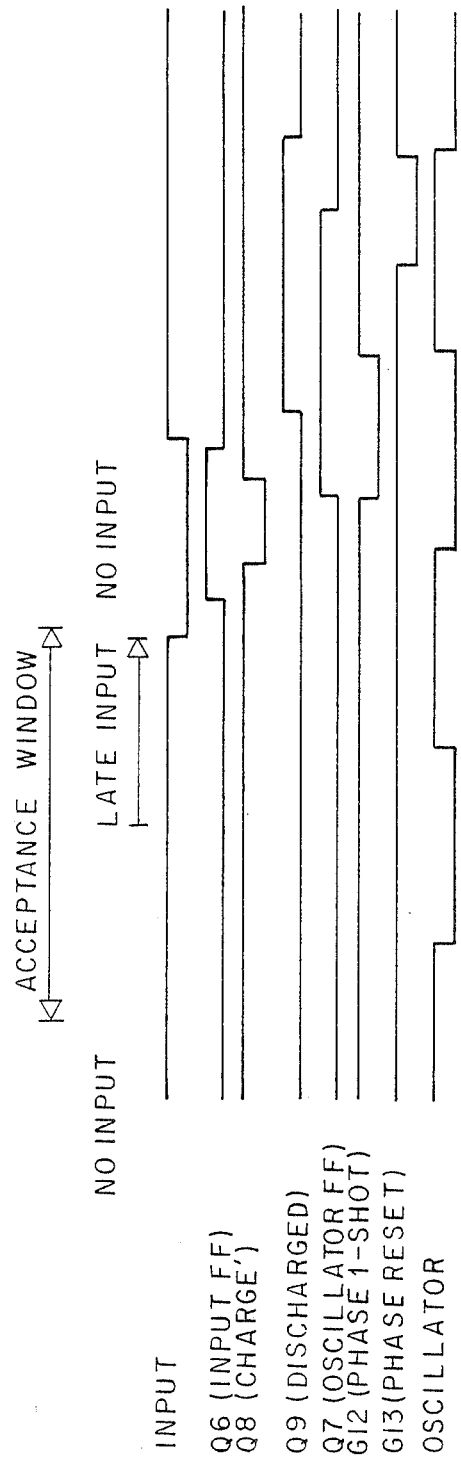

PHASE-FREQUENCY COMPARE CIRCUIT FOR PHASE LOCK LOOP

FIELD OF THE INVENTION

The present invention relates to a phase locked loop circuit for extracting a clock signal from a stream of input data and using the extracted clock to synchronize the data.

BACKGROUND OF THE INVENTION

A phase locked loop circuit includes three essential blocks, namely, a phase/frequency comparator, a charge pump and integrator and a voltage controlled oscillator. The function of the phase locked loop is to adjust the oscillator frequency until it tracks the input signal except that in a phase condition the frequency of the input may be a subharmonic of the oscillator frequency. This frequency may then be used to synchronize the input data. In cases where the incoming data is a self clocking bit stream, the comparator system is used to extract the clock information from the data stream itself.

The purpose of the phase/frequency comparator is to compare the phase and/or frequency of incoming data signals to clock signals in order to establish an oscillator frequency which can synchronize the data signals. Thus, any jitter in the incoming data can be eliminated and the synchronized data can then be fed into an external decoder.

In a typical application there are periods when data is being sent and periods when no data is being sent. External control circuitry is normally used to identify when data is being sent so that proper control circuitry can be established. Before data is sent, a crystal oscillator or a clock generator generating a clock signal of a known or reference frequency sends a the clock signal of a fixed frequency to the system. Accordingly, when data transmission begins the system is in a frequency mode and locked to the reference frequency signal. Immediately prior to data being sent there is a preamble condition of a fixed known frequency that is a sub-harmonic (e.g., $\frac{1}{2}$, $\frac{1}{3}$, $\frac{1}{4}$ . . . ) of the clock frequency.

On arrival of the preamble condition the system is switched from a frequency mode to a phase mode. In the phase mode the phase detector establishes a phase window of $-180$ degrees to $+180$ or one clock period of the a voltage controlled oscillator (VCO). The task of the phase detector is to compare the relative phase of each data bit with the phase of a VCO clock bit. Thus, phase comparison is made only in the presence of a data bit utilizing a necessarily well centered phase window. For a detected phase error of zero degrees the phase detector applies no correction to the charge pump. A detected phase error of $+180$ degrees has a maximum positive correction while a detected error of $-180$ degrees has a maximum negative correction. In the complete phase-locked loop, if the data bit precedes the voltage controlled oscillator clock bit, i.e. the voltage controlled oscillator clock appears slow or lagging, the sense of the corrective action of the phase detector/-charge pump is to increase the frequency of the voltage controlled oscillator; and conversely, if the voltage ,controlled oscillator clock bit precedes the data bit the oscillator the frequency is decreased.

Previous methods of implementing a phase detector have employed one of three techniques to enable the phase detector for phase comparison only when a data bit is present. The first method uses passive tapped delay line with a delay of $\frac{1}{2}$ the period of the VCO clock. The phase comparison is made relative to the rising edges of the delayed data bit and the VCO clock. Passive delay lines which are distributed inductors and capacitors are not suitable for semiconductor integration. Consequently, it is undesirable to require an off chip delay line for reasons of expense, space and convenience. A second phase detector approach similar to the above is the use of an active delay in place of the passive one. Although an active delay can be integrated on a chip, it requires more circuitry for the integration and, thus makes the circuit relatively large and expensive.

A third phase detector method eliminates the need for the delay by establishing a variable charge period which occurs due to a data bit and which enables a fixed discharge period lasting approximately half the period of the oscillator. When the two signals are in phase-lock they are approximately 180 degrees out of phase, and the duration of the charge and discharge periods are equal.

An all digital frequency compare method which has previously been used with phase compare method three employs logic gates and digital memory elements (flip flops). It has a phase quadrature lock-up problem in which there are two stable phase relationships which occur with a $\pm 90$ degree relative phase error. Because this bistable condition is indeterminate and random, randomly occurring disturbances to the phase locked loop can occur when switching the phase mode to frequency mode and back again result. A design approach to the third method has been to use separate circuits for the phase compare and frequency compare modes of operation. The separate circuitry for phase and frequency compare has involved greater complexity and cost than would be the case for a single circuit adapted to carry out both comparison functions. Traditional combined circuits which have been capable of doing both a phase and a frequency comparison such as phase methods one and two have also required a separate compare cycle enable circuit which is activated by the undelayed input for a comparison or which is constantly enabled for a frequency compare mode of operation. Clearly, the more circuitry involved the more will be the delay and the slower will be the operating frequency of the circuit.

Accordingly, an object of the present invention is to provide an improved phase locked loop circuit. A further object of the present invention is to provide a phase-locked loop circuit capable of operating at relatively high frequencies. Yet another object of the present invention is to provide a phase locked loop circuit which eliminates the uncertainty associated with phase quadrature lock up in the frequency mode of operation.

SUMMARY OF THE INVENTION

According to one aspect of the invention there is provided a phase and frequency comparison circuit which includes a phase/frequency selector switch, a charge pump control circuit having a data input, an oscillator input, a charge output and a discharge output, a charge pump having a charge input coupled to the charge output of the control circuit and a discharge input coupled to the discharge output of the control circuit, a voltage controlled oscillator having an input coupled to an output of the charge pump and an output coupled to the oscillator input of the control circuit.

The selector switch is operative to select either a frequency or phase comparison mode. The control circuit is operative in the frequency mode to generate a charge output signal which is longer in duration than a corresponding discharge signal when a data input signal arrives before an oscillator signal from the oscillator, and a discharge signal longer in duration than a corresponding charge signal when the oscillator signal arrives before the data input signal. When there has been a previous input, the start of the oscillator signal triggers the removal of the charge and discharge signals from to the charge pump after a short delay. When the oscillator signal arrives before the input signal, the arrival of the input signal triggers the removal of both the charge and discharge signal.

In the phase mode a charge signal is generated when an input data signal arrives. The duration of the charge signal depends on the phase difference between the input data signal and the oscillator signal since the start of the charge signal depends on the arrival of the data signal while the end of the charge signal depends on the arrival time of the negative going oscillator signal. The duration of the discharge signal, however, is fixed since is enabled triggered by the end of the charge signal (which depends on the arrival of the oscillator signal) and it is disabled by a signal which also depends on the oscillator. When phase locked, the duration of the charge and discharge signals are approximately the same. The circuit requires no external delay and can utilize only a single circuit for both phase and frequency compare modes.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIGS. 3a, 3b and 3c are waveform diagrams for the phase compare mode for the circuit of FIG. 1;

DETAILED DESCRIPTION

Figure 1:
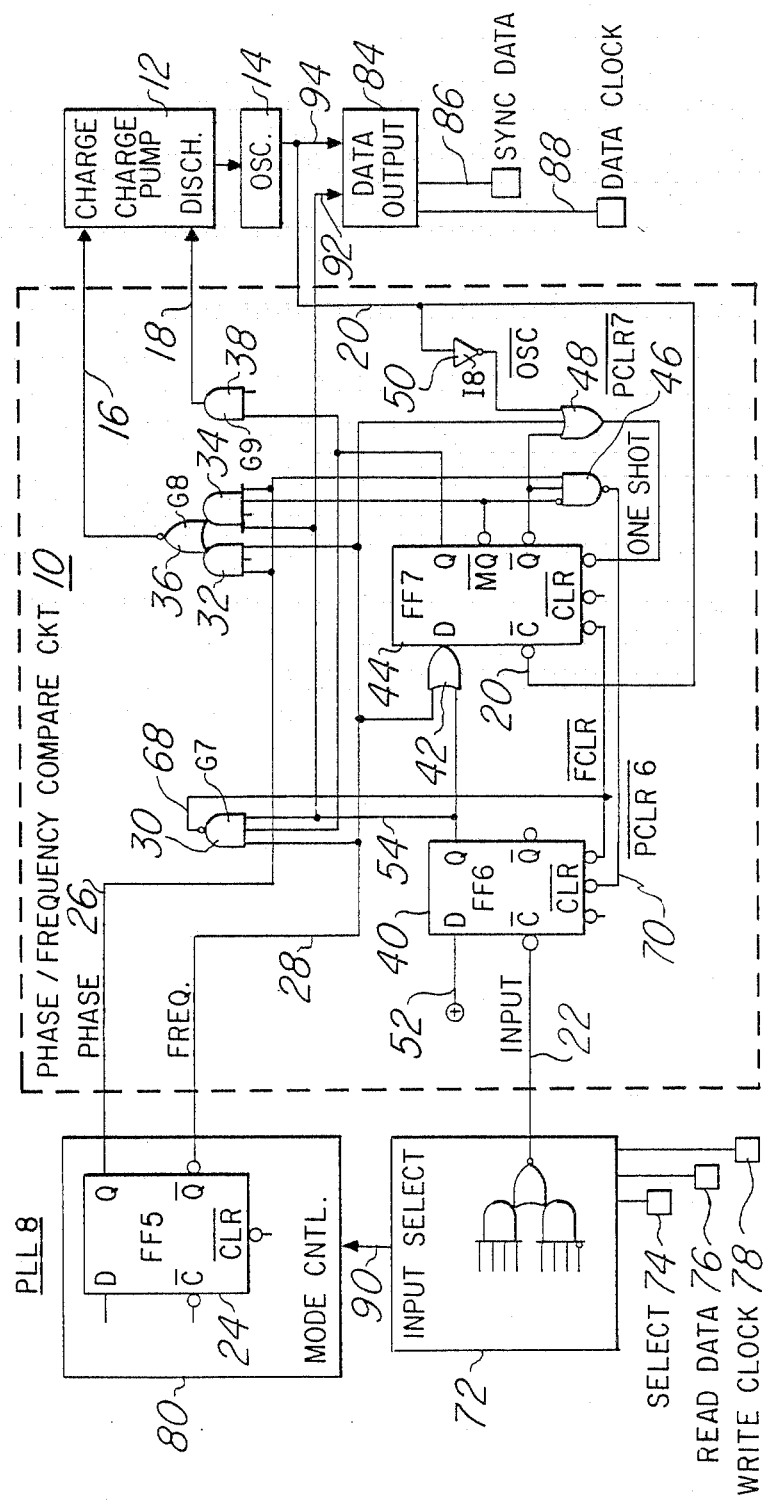
FIG. 1 a block diagram of a phase-locked loop circuit having phase and frequency operating modes and embodying the invention.

Referring to FIG. 1, there is shown a block diagram of the phase-locked loop circuit (PLL8) in accordance with a preferred embodiment of the invention. The PLL circuit consists of a phase-frequency compare circuit 10 (outlined in phantom) coupled to a charge pump 12. The charge pump 12, in turn, is coupled to a voltage controlled oscillator 14 an output of which is fed back by line 20 to the phase-frequency compare circuit 10. The charge pump has a charge and a discharge inputs coupled to charge and discharge lines 16 and 18, respectively, of the phase-frequency compare circuit 10. Negative signals on line 16 cause the charge pump output to rise while positive signals on line 18 cause it to fall.

The phase-frequency compare circuit 10 is coupled to a mode control unit 80 which includes a phase-frequency selector flip flop 24 having complementary Q and Q (complement) outputs. A data signal flip flop 40 has a D input coupled by line 52 to a source of positive voltage and a clock input C coupled by input line 22 to a source of incoming data signals provided by an input select unit 72 having inputs 74, 76, and 78 for receiving select, read data and write clock signals, respectively. Flip flop 40 triggers on negative going data signals from line 22. The Q output of flip flop 40 is coupled to the inputs of a NAND gate 30, AND gates 32 and 34 and to OR gate 42. The Q output of flip-flop 42 is also connected to input 92 of a data output circuit 84 having another input 94 connected to receive the oscillator 14 output signal (on line 20) and having outputs 86 and 88 for providing data and data clock output signals, respectively.

The output of OR gate 42 feeds the D input of an oscillator flip flop 44. Flip flop 44 is clocked by the negative going oscillator signal coupled by line 20 from the output of oscillator 14. The Q output of flip flop 44 connects to the input of AND gate 38. The output of AND gate 38 is coupled by line 18 to the discharge input of charge pump 12. The MQ (complement) output of flip flop 44 connects both to an input of phase AND gate 34 and to an inverting input of NAND gate 46. The Q (complement) output of flip flop 44 is connected by line 62 to an input of NAND gate 46 and to an input of OR gate 48. The other two inputs of OR gate 48 connect to the output of an inverter 50, whose input connects to the oscillator signal on line 20, and to the Q (complement output) by line 28 of flip flop 24. The output of OR gate 48 connects to a clear pin of flip flop 44.

The other two inputs of NAND gate 46 connect to a phase line 26 connected to the Q output of flip flop 24 and to the Q (complement) output of flip flop 44. The output of NAND gate 46 connects to the clear input of flip flop 40. A low signal going into the clear input of either of flip flops 40 or 44 reset the associated flip flop making the Q output low and the Q (complement) output high.

Frequency AND gate 32 also has one input connected to frequency select line 28 and so is enabled only when the voltage on the latter line is high. Phase AND gate 34 has, in addition to the input connected to Q output of flip flop 40, an input connected to the MQ (complement) output of flip flop 44 and one connected by phase line 26 to the Q output of flip flop 24. The outputs of each gate 32 and 34 connect to the inputs of NOR gate 36. The output of NOR gate 36 connects by line 16 to the charge input of charge pump 12.

NAND gate 30 has one input connected to the Q output of flip flop 44 and one connected to the frequency line 28. The output of gate 30 is coupled to clear inputs of flip flops 40 and 44 via line 68.

Figure 2:
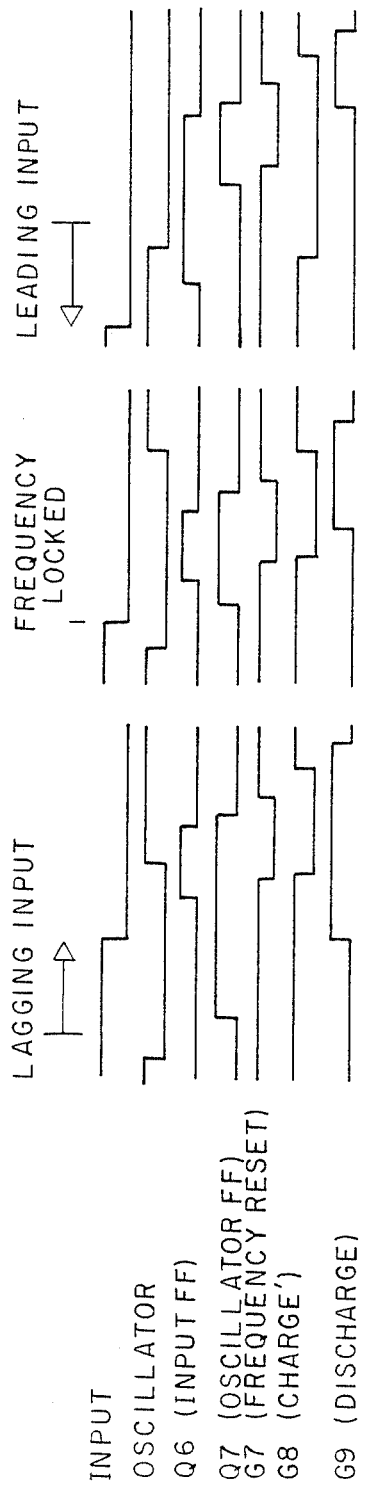
FIG. 2 is waveform diagram for the frequency compare mode for the circuit of FIG. 1.

In the frequency mode, the Q (complement) output on frequency line 28 is high while the Q output on phase line 26 is low. Thus, NAND gate 30 and AND gate 32 are enabled while OR gate 48 is disabled and NAND gate 46 is disabled. In addition, the high input into OR gate 42 is transmitted to the D input of flip flop 44. Assuming that initially both flip flops 40 and 44 are reset so that their Q outputs are low, and referring to the waveform shown in FIG. 2, if the oscillator signal falls before the input signal, flip flop 44 will be clocked by the falling oscillator signal on line 20. Since in the frequency mode the signal on line 28 will be high, OR gate 42 transmits a high level to the D input of flip flop 44 which, on being clocked, produces a high level Q output and low outputs on MQ (complement) and Q. In one example of a preferred design, the MQ (complement) signal drops within 0.26 nanoseconds of the falling oscillator pulse while Q (complement) rises 2.4 nanoseconds later and Q falls 4.07 nanoseconds later. The Q output after application to the input of AND gate 38 produces a high level output on discharge line 18 denoted DIS on FIG. 2. The high level Q output also is applied to one input of NAND gate 30 which now has two of its three inputs high.

Upon arrival of the falling input signal, flip flop 40 is clocked producing a high level signal on its Q output which is taken by line 54 to the third input of NAND gate 30. The high level Q output from flip flop 40 is applied also to one of the inputs of AND gate 32. Since both inputs of the latter in the frequency mode are high a high output is applied to NOR gate 36 producing a low on charge line 16. The three highs on the three inputs of NAND gate 30 produce a low level signal on line 68 which is applied to the clear input of both flip flop 40 and flip flop 44 resetting both. The fallen Q outputs of flip flops 40 and 44 being applied to AND gates 32 and 38, respectively, result in the signal on discharge line 16 going high and that on line 18 going low. In the latter case the falling oscillator signal initiates the rise in voltage on discharge line 18 while the falling input initiates the fall on the charge line 16 as well as both the subsequent rise of voltage on charge line 16 and the drop of voltage on discharge line 18. Thus, the discharge signal on line 18 is extended by an amount which is dependent on the time difference between the falling edges of the oscillator and the input signals when the input lags the oscillator.

When the falling edges of the oscillator and input occur at substantially the same time the outputs on charge and discharge lines 16 and 18, respectively, are of substantially the same duration. Similarly, when the fall of the input signal leads the fall of the oscillator signal, the charge signal on line 16 is extended rather than the discharge signal on line 18.

When the discharge signal is extended relative to the charge signal, the voltage output from the charge pump is lowered thus lowering the output frequency of the voltage controlled oscillator 14. A lowered output frequency of the oscillator will tend to bring the oscillator fall and input fall closer for an input which lags the oscillator. Conversely, when the charge signal is extended relative to the discharge signal, the voltage output from the charge pump is raised, thus raising the output frequency of the voltage controlled oscillator 14. A raised oscillator output frequency tends to bring the oscillator fall closer to the input fall when the input leads the oscillator. At frequency lock the charge and discharge energies (current X time) are equal.

In the phase mode, the voltage on frequency line 28 is low while that on phase line 26 is high. The high level on phase line 26 enables NAND gate 46 and AND gate 34. If the oscillator signal is the first one to fall, then the Q output of flip flop 40 will be low as will be the D input of flip flop 44. On arrival of the oscillator signal fall, the flip flop 44 will be clocked but the outputs of flip flop 44 will remain unchanged. Thus, no charge or discharge signal will be generated without a falling input signal on input line 22.

The arrival of an input signal on line 22 clocks flip flop 40 and results in a positive Q output on line 54 which enables NAND gate 30, causes AND gate 34 to provide a positive output and initiates a transition to a low level signal on line 16. When a falling oscillator signal arrives following the input signal arrival, flip flop 44 is clocked giving first a falling MQ (complement) output shortly after the clock transition which disables AND gate 34. Next the Q output goes high initiating a high level output on discharge line 18. Finally, prior to the Q output going low, all of the inputs to one shot 46 are such as to cause a transition on line 70 to a low level which clears flip flop 40. When the Q output goes low it disables one shot 46 and enables OR gate 48.

Figure 3A:
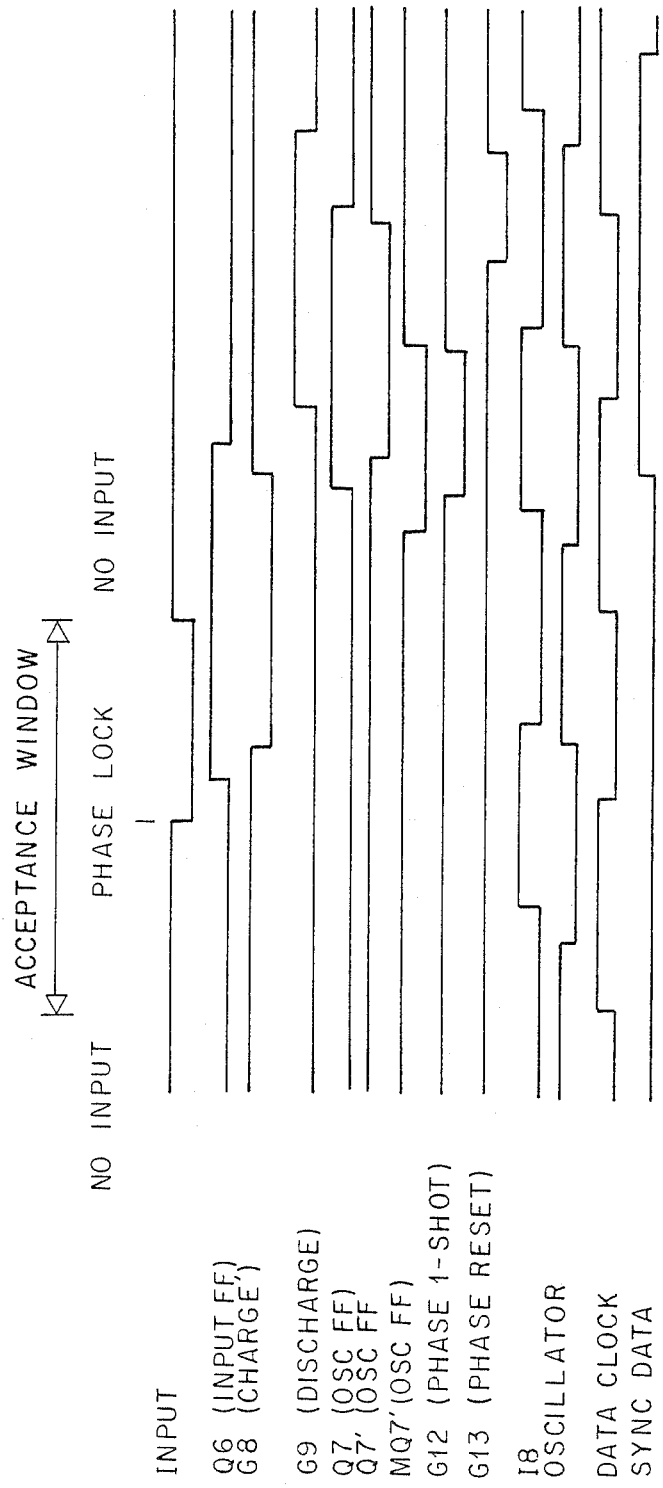
Figure 4A:
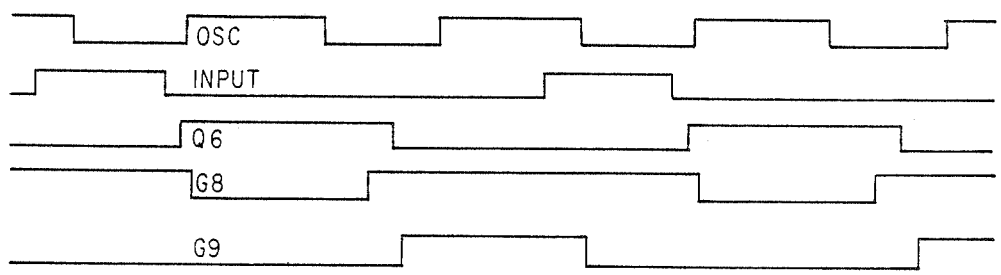
FIGS. 4a, 4b and 4c are waveform diagrams for the phase compare mode for the circuit of FIG. 1 showing three different sets of input data signals.
Figure 4B:
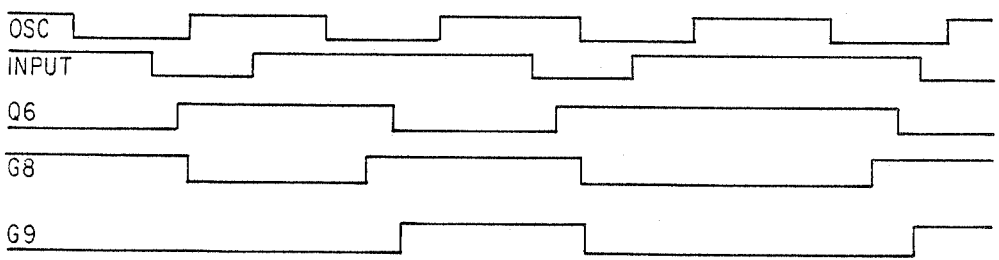
Figure 4C:
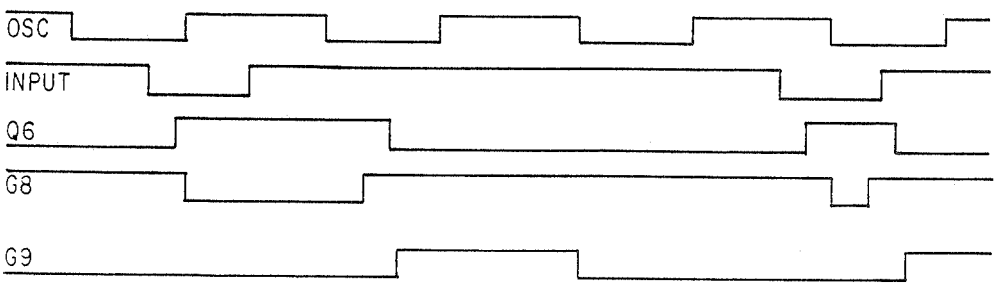

When the oscillator signal goes high again the output of inverter 50 is low causing OR gate 48 to produce a low output which clears flip flop 44. In fact, the MQ (complement) output returns to a high level before the flip flop reset in response to the oscillator output going to a high level. The waveform diagram of FIG. 3 illustrates the timing involved for the input lagging the oscillator. FIGS. 4a, 4b, and 4c illustrate the waveforms for the input phase locked to the oscillator, an input signal just before the oscillator fall and for an input signal just after the oscillator fall, respectively. It will be noted that the discharge signal from AND gate 38 labelled G9 is of the same duration in each case whereas the charge signal from NOR gate 36 on charge line 16 is longer than the discharge signal when the input is before the oscillator signal and is shorter when it is after the oscillator signal.

It will be noted that in the waveforms of FIG. 3, the input frequency can be lower than the oscillator frequency in the phase mode. In fact, preferably the input frequency is no more than ½ the oscillator frequency. Ordinarily, input data is operated in the phase mode whereas clock input data is operated in the frequency locked mode.

It will be appreciated that rather than using an OR circuit 42 to select whether the frequency line 28 or the Q output from flip flop 40 is applied to the D input of flip flop 44, it is possible to use other equivalent logic to perform the same function such as a NAND gate having inputs coupled to the Q (complement) output of flip flop 40 and to line 26.

By utilizing the same flip flops for both phase and frequency modes, considerable circuit simplification is achieved.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. A phase/frequency compare circuit for use in a phase locked loop circuit having a charge pump and a voltage controlled oscillator, comprising:
    an input flip flop having a clock input coupled to an input signal source and a data input coupled to a high level voltage source;
    an oscillator flip flop having a clock input coupled to an output of the voltage controlled oscillator;
    a frequency/phase selector having complementary frequency and phase outputs for placing said phase/frequency compare circuit in a frequency or phase compare mode, respectively;
    a switch gate having an output coupled to a data input of said oscillator flip flop, a phase input coupled to an output of said input flip flop and a frequency input coupled to the frequency output of said frequency/phase selector wherein the switch gate output is high when either in the frequency mode or, if in the phase mode, following the arrival of an input signal to said input flip flop;

charge logic gates having inputs coupled to the output of said input flip flop, to the frequency and phase outputs of said selector and to an output of said oscillator flip flop and an output coupled to a charge input of said charge pump operative to apply a charge signal to the charge input in response to an input signal setting said input flip flop when the frequency output of said selector is high and, if the oscillator flip flop is reset, when the phase output of said selector is high;

a discharge gate having an input coupled to an output of said oscillator flip flop and an output coupled to a discharge input of said charge pump for generating a discharge control signal in response to the arrival of an oscillator signal provided, when the phase output of said selector is high, there has been a previous input signal; and reset circuitry coupled to said input and oscillator flip flops and operative to reset them in response to predetermined conditions of said selector outputs, said input and oscillator flip flop outputs and said oscillator signal level.

2. A phase/frequency compare circuit according to claim 1, wherein said reset circuitry includes a frequency reset one shot multivibrator having inputs coupled to said frequency output, the input of said discharge gate and to said input flip flop output and operative to reset said input and oscillator flip flops when in the frequency mode and in response to the setting of said oscillator flip flop.

3. A phase/frequency compare circuit according to claim 1, wherein said reset circuitry includes a phase one-shot multivibrator having an output coupled to said input flip flop and inputs coupled to complementary outputs of said oscillator flip flop and to said selector phase output and operative to reset said input flip flop when in a phase mode in response to the initiation of setting of said oscillator flip flop.

4. A phase/frequency compare circuit according to claim 1, wherein said reset circuitry includes a gate having an output coupled to said oscillator flip flop and inputs coupled to said oscillator output, said selector frequency output and to a complementary output of said oscillator flip flop and operative to reset said oscillator flip flop when in the phase mode in response to arrival of the second half of an oscillator signal.

5. A phase/frequency compare circuit according to claim 1, wherein said charge logic gates include a frequency AND gate having inputs coupled to said selector frequency output and to said input flip flop output and a phase AND gate having inputs coupled to said selector phase output, said oscillator flip flop output and to said input flip flop output and a NOR gate having inputs coupled to the outputs of said frequency and phase AND gates and an output coupled to a charge input of said charge pump.

6. A phase/frequency compare circuit according to claim 1, wherein said selector is a flip flop.

7. A phase/frequency compare circuit according to claim 1, wherein said switch gate is an OR gate.

8. A phase/frequency compare circuit for use in a phase locked loop circuit having a charge pump and a voltage controlled oscillator, comprising:

an input flip flop having a clock input coupled to an input signal line;

an oscillator flip flop having a clock input coupled to an output of said oscillator;

a frequency/phase selector flip flop having complementary frequency and phase outputs for placing said circuit in a frequency and phase mode, respectively;

means for selectively applying an output of said input flip flop during a phase mode and selector frequency output during a frequency mode to a data input of said flip-flop;

means for generating a charge control signal for a charge input of said charge pump in response to an output signal from said input flip flop and, in the phase mode, only when said oscillator flip flop is reset;

a discharge gate having an input coupled to an output of said oscillator flip flop and an output coupled to a discharge input of said charge pump for generating a discharge control signal in response to setting of said oscillator flip flop; and reset means for resetting said input and oscillator flip flops in response to setting of said oscillator flip flop except in a phase mode in which said reset means resets said oscillator flip flop in response to arrival of a second half of said oscillator signal.

9. A phase/frequency compare circuit according to claim 8, wherein said reset means includes a frequency reset one shot multivibrator having inputs coupled to said frequency output, the input of said discharge gate and to said input flip flop output and operative to reset said input and oscillator flip flops when in the frequency mode and in response to the setting of said oscillator flip flop.

10. A phase/frequency compare circuit according to claim 8, wherein said reset, means circuitry includes a phase one-shot multivibrator having an output coupled to said input flip flop and inputs coupled to complementary outputs of said oscillator flip flop and coupled to said selector flip flop output and operative to reset said input flip flop when in a phase mode in response to the initiation of setting of said oscillator flip flop.

11. A phase/frequency compare circuit according to claim 8, wherein said reset means includes a gate having an output coupled to said oscillator flip flop and inputs coupled to said oscillator output, said selector frequency output and to a complementary output of said oscillator flip flop and operative to reset said oscillator flip flop when in the phase mode in response to arrival of the second half of a oscillator signal.

12. A phase/frequency compare circuit according to claim 8, wherein said charge generating means includes a frequency AND gate having inputs coupled to said selector frequency output and to said input flip flop output and a phase AND gate having inputs coupled to said selector phase output, said oscillator flip flop output and to said input flip flop output and a NOR gate having inputs coupled to the outputs of said frequency and phase AND gates and an output coupled to a charge input of said charge pump.

13. A phase/frequency compare circuit according to claim 8, wherein said selector is a flip flop.

14. A phase/frequency compare circuit according to claim 8, wherein said switch gate is an OR gate.

* * * * *